(12) United States Patent
Chu et al.

(10) Patent No.: US 10,720,415 B2
(45) Date of Patent: Jul. 21, 2020

(54) DISPLAY DEVICE AND METHOD FOR FORMING THE SAME

(71) Applicant: InnoLux Corporation, Miao-Li County (TW)

(72) Inventors: Wei-Cheng Chu, Miao-Li County (TW); Ming-Fu Jiang, Miao-Li County (TW); Chia-Cheng Liu, Miao-Li County (TW); Chih-Yuan Lee, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/698,777

(22) Filed: Sep. 8, 2017

(65) Prior Publication Data

US 2018/0122787 A1 May 3, 2018

Related U.S. Application Data

(60) Provisional application No. 62/415,542, filed on Nov. 1, 2016.

(30) Foreign Application Priority Data

Jun. 5, 2017 (CN) .......................... 2017 1 0414084

(51) Int. Cl.
*H01L 25/16* (2006.01)
*H01L 33/58* (2010.01)
(Continued)

(52) U.S. Cl.
CPC ........ *H01L 25/167* (2013.01); *H01L 25/0753* (2013.01); *H01L 33/58* (2013.01);
(Continued)

(58) Field of Classification Search
CPC ... H01L 25/167; H01L 25/0753; H01L 33/58; H01L 33/62; H01L 33/52; H01L 2933/005; H01L 2933/0033; H01L 2933/0066

See application file for complete search history.

(56) References Cited

U.S. PATENT DOCUMENTS 9,144,119 B2 9/2015 Kim
2005/0233504 A1* 10/2005 Doi ..................... H01L 21/6835
438/127

(Continued)

FOREIGN PATENT DOCUMENTS

CN 101866910 A 10/2010
CN 103682143 A 3/2014

OTHER PUBLICATIONS

Chinese language office action dated Dec. 17, 2019, issued in application No. CN 201710414084.7.

*Primary Examiner* — Su C Kim
(74) *Attorney, Agent, or Firm* — McClure, Qualey & Rodack, LLP

(57) ABSTRACT

A display device is provided. The display device includes a substrate having a first surface and a second surface opposite to the first surface, a plurality of light-emitting units disposed on the first surface of the substrate, and a plurality of conductive structures extending into the substrate from the second surface of the substrate. The plurality of conductive structures are electrically connected to the plurality of light-emitting units.

7 Claims, 16 Drawing Sheets

(51) Int. Cl.
  *H01L 25/075* (2006.01)
  *H01L 33/62* (2010.01)
  *H01L 33/52* (2010.01)
(52) U.S. Cl.
  CPC .............. *H01L 33/52* (2013.01); *H01L 33/62* (2013.01); *H01L 2933/005* (2013.01); *H01L 2933/0033* (2013.01); *H01L 2933/0066* (2013.01)

(56) References Cited

U.S. PATENT DOCUMENTS

| | | | | |
|---|---|---|---|---|
| 2006/0154390 | A1* | 7/2006 | Tran | B23K 26/40 |
| | | | | 438/22 |
| 2010/0123239 | A1* | 5/2010 | Kunimoto | H01L 23/5389 |
| | | | | 257/690 |
| 2010/0244059 | A1* | 9/2010 | Iida | H05K 1/181 |
| | | | | 257/88 |
| 2012/0248485 | A1* | 10/2012 | Shinbori | H01L 33/56 |
| | | | | 257/98 |
| 2014/0106486 | A1* | 4/2014 | Tsutsui | H01L 25/0753 |
| | | | | 438/27 |
| 2014/0264396 | A1* | 9/2014 | Lowenthal | H01L 33/08 |
| | | | | 257/88 |
| 2015/0200153 | A1* | 7/2015 | Wang | H01L 24/82 |
| | | | | 257/774 |
| 2015/0249069 | A1* | 9/2015 | Yoshida | H01L 33/62 |
| | | | | 257/89 |
| 2015/0307020 | A1* | 10/2015 | Salter | B60Q 1/2696 |
| | | | | 362/510 |
| 2016/0254423 | A1* | 9/2016 | Bergmann | H01L 33/54 |
| | | | | 257/89 |
| 2017/0033009 | A1* | 2/2017 | Scanlan | H01L 24/20 |

* cited by examiner

DISPLAY DEVICE AND METHOD FOR FORMING THE SAME

CROSS REFERENCE TO RELATED APPLICATIONS

This application claims priority of application China Patent Application No. 201710414084.7 filed on Jun. 5, 2017, and provisional application of, U.S. Patent Application No. 62/415,542 filed on Nov. 1, 2016, the entirety of which are incorporated by reference herein.

BACKGROUND

Technical Field

The disclosure relates to display devices, and in particular to borderless display devices.

Description of the Related Art

As digital technology develops, display devices are becoming more widely used in our society. For example, display devices have been applied in modern information and communication devices such as televisions, notebook computers, desktop computers, mobile phones (e.g., smartphones). In addition, each generation of display devices has been developed to be thinner, lighter, smaller, and more fashionable than the previous generation. The display devices include light-emitting diode display devices.

The recombination radiation of electron and hole in the light-emitting diode may produce electromagnetic radiation (such as light) through the current at the p-n junction. For example, in the forward bias p-n junction formed by direct band gap materials such as GaAs or GaN, the recombination of electron and hole injected into the depletion region results in electromagnetic radiation such as light. The aforementioned electromagnetic radiation may lie in the visible region or the non-visible region. Materials with different band gaps may be used to form light-emitting diodes of different colors.

Since mass production has become the tendency recently in the light-emitting diode industry, any increase in the yield of manufacturing light-emitting diodes will reduce costs and result in huge economic benefits. However, existing display devices have not been satisfactory in every respect.

Therefore, a cost-effective display device is needed.

BRIEF SUMMARY

Some embodiments of the disclosure provide a display device. The display device includes a substrate having a first surface and a second surface opposite to the first surface; a plurality of light-emitting units disposed on the first surface of the substrate; and a plurality of conductive structures extending into the substrate from the second surface of the substrate. The plurality of conductive structures are electrically connected to the plurality of light-emitting units.

Some embodiments of the disclosure provide a method for forming a display device. The method includes providing a carrier with a plurality of light-emitting units; coating a substrate material on the carrier such that the substrate material surrounds the plurality of light-emitting units; curing the substrate material to form a substrate; removing a portion of the substrate to expose the plurality of light-emitting units; and disposing a driver unit on the substrate. The driver unit is electrically connected to the plurality of light-emitting units.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1A:
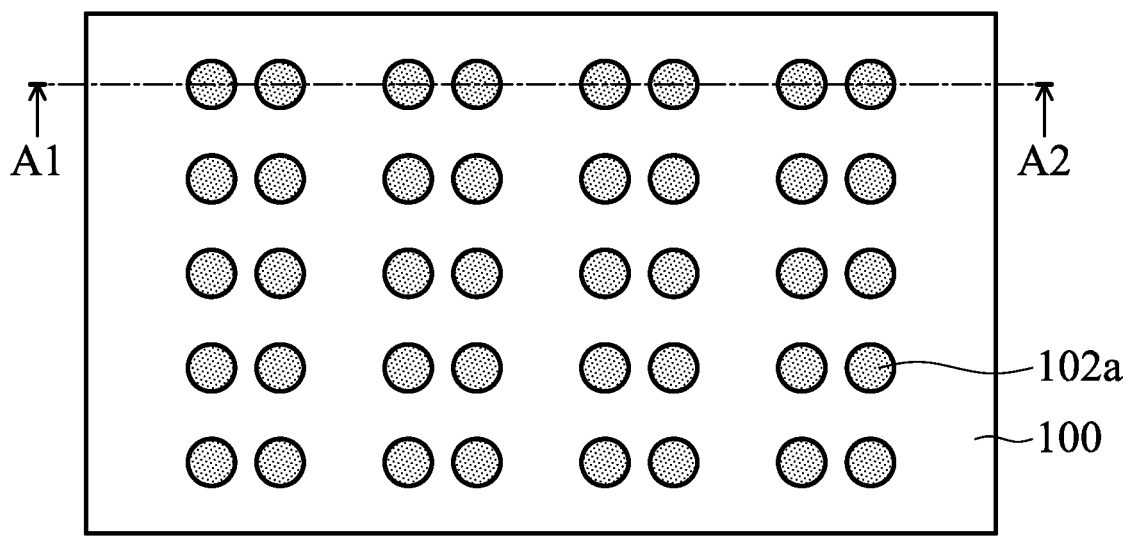
FIG. 1A illustrates a top view of a forming step of a display device according to Embodiment 1 of the present disclosure.

The display device of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

This description of the exemplary embodiments is intended to be read in connection with the accompanying drawings, which are to be considered part of the entire written description. The drawings are not drawn to scale. The dimensions of the various features may be arbitrarily increased or reduced for clarity of discussion. In addition, structures and devices are shown schematically in order to simplify the drawing.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

In the display device of the present disclosure, the light-emitting units and the driver unit (or other devices) are disposed on opposite surfaces of the substrate, and the light-emitting units are electrically connected to the driver unit through the conductive structures. Compared to display devices in which the light-emitting units and the driver unit are disposed on the same surface of the substrate, the display devices of the present disclosure do not have to sacrifice the peripheral area around the light-emitting units for disposing the driver unit, and thus a borderless design can be achieved.

Embodiment 1

Embodiment 1 provides a method for forming a display device in which the light-emitting units and the driver unit are disposed on opposite surfaces of the substrate.

Figure 1B:
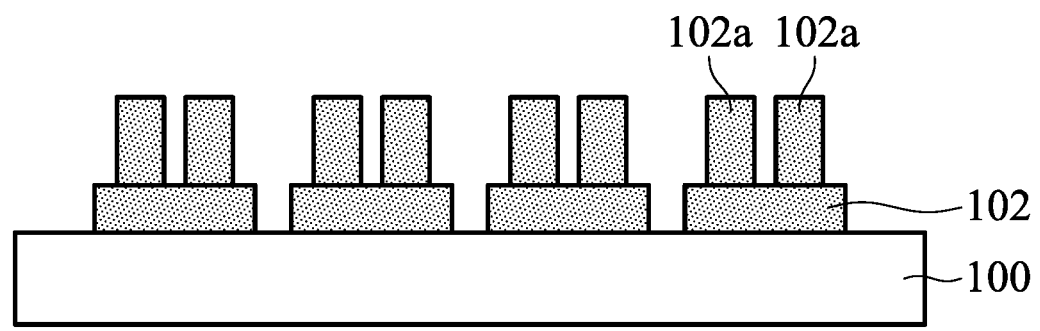
FIGS. 1B, 2A, 2B, and 3-10 are a series of cross-sectional views illustrating a method for forming a display device according to Embodiment 1 of the present disclosure.

FIGS. 1A and 1B illustrate a forming step of the display device of the present embodiment, and FIG. 1A is the top view of the forming step. FIG. 1B illustrates a cross-sectional view along line A1-A2 in FIG. 1A. As shown in FIGS. 1A and 1B, a carrier 100 with a plurality of light-emitting units 102 disposed thereon is provided. For example, the carrier 100 includes a semiconductor wafer, a glass carrier, a ceramic carrier, a plastic carrier, other applicable carriers, or a combination thereof. For example, the light-emitting units 102 can be light-emitting diodes, organic light-emitting diodes (OLED), other applicable light-emitting units, or a combination thereof. In some embodiments, the light-emitting units 102 can be micro light-emitting diodes (micro LEDs), and one or more arrays of which can be formed on the carrier 100. In some embodiments, the light-emitting units 102 can be formed on the carrier 100 (e.g., a semiconductor wafer) by semiconductor processes. In other embodiments, the light-emitting units 102 are bonded to the carrier 100 through applicable bonding materials (e.g., optical adhesive, pressure sensitive adhesive, other applicable bonding materials, or a combination thereof). As shown in FIG. 1B, conductive structures 102a can be disposed on the light-emitting units 102 to electrically connect the light-emitting units 102 to various devices (e.g., driver) or units (e.g., outer lead bonding). In some embodiments of which the light-emitting units 102 are light-emitting diodes, the conductive structures 102a can be the leads of the light-emitting diodes.

Figure 2A:
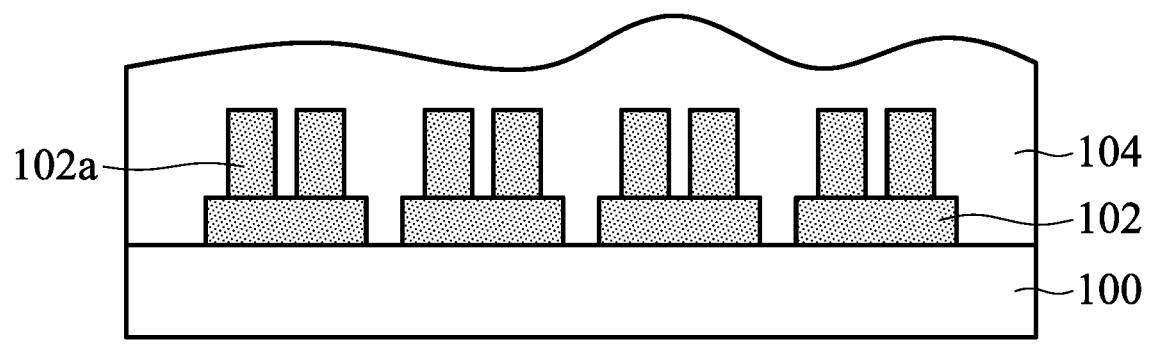
Figure 2B:
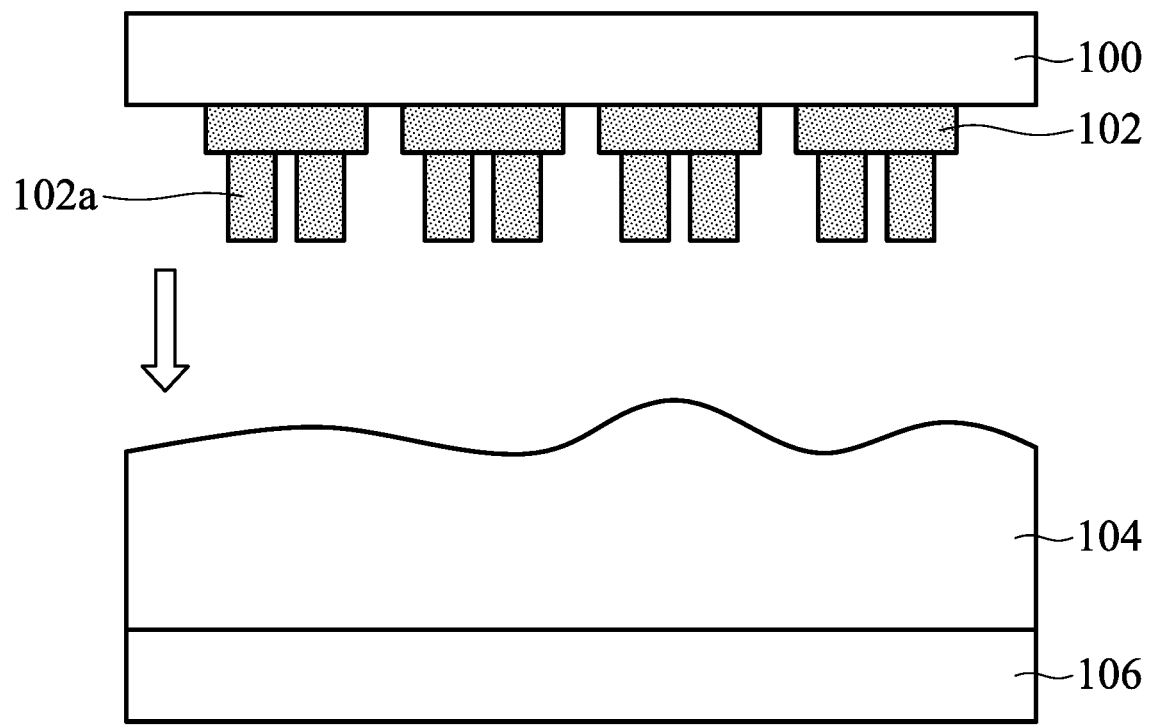

Then, as shown in FIG. 2A, a substrate material 104 is coated on the carrier 100, such that the light-emitting units 102 and the conductive structures 102a are surrounded by the substrate material 104. For example, the substrate material 104 can include a precursor of polymer (e.g., a precursor of polyimide), glass, other applicable materials, or a combination thereof. In some embodiments, if needed, the substrate material 104 can be heated to an applicable temperature (e.g., greater than or equal to the glass transition temperature of the glass) to increase the flowability thereof, and then be coated on the carrier 100. It should be noted that although the top surface of the substrate material 104 is higher than the top surface of the conductive structures 102a in FIG. 2A, the present disclosure is not limited thereto. For example, the top surface of the substrate material 104 can also be lower than or level with the top surface of the conductive structures 102a. In some embodiments, the substrate material 104 can be coated on the carrier 100 using spin-on coating or other applicable methods at an applicable temperature (e.g., 25-100° C.). In other embodiments, as shown in FIG. 2B, the substrate material 104 can be disposed on another carrier or tank 106 in advance, and then the carrier 100 and the light-emitting units 102 are flipped and moved toward the substrate material 104 until the substrate material 104 surrounds the light-emitting units 102 and the conductive structures 102a and contacts the carrier 100.

Figure 3:
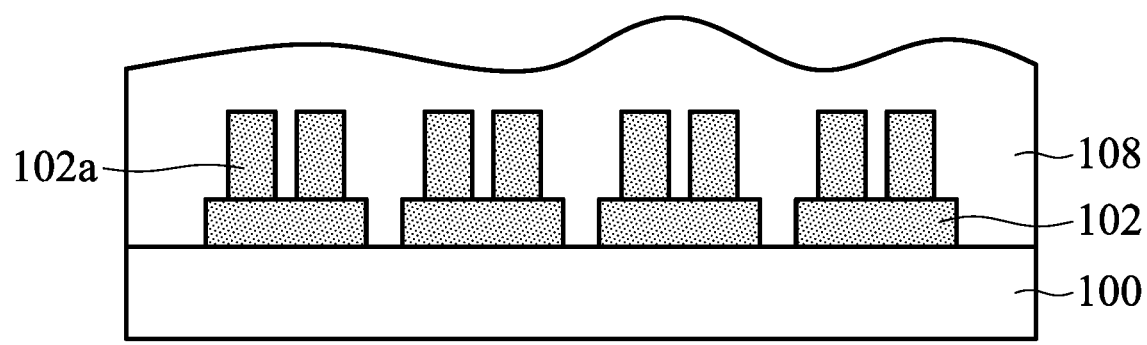

Then, as shown in FIG. 3, a curing process can be performed to cure the substrate material 104, such that a substrate 108 is formed. In some embodiments, the substrate 108 can include polymer (e.g., polyimide), glass, other applicable materials, or a combination thereof. For example, in the embodiments of which the substrate material 104 is a precursor of polymer, the curing process can include thermal curing process (e.g., heating the substrate material 104 to a temperature of 100-500° C. and lasting for several seconds to several hours), UV-light curing process (e.g., exposing the substrate material 104 to UV-light for several seconds to several hours), other applicable curing processes, or a combination thereof. In other embodiments of which the substrate material 104 is glass, the substrate material 104 can be cured to form the substrate 108 by cooling the substrate material 104 to an applicable temperature (e.g., a temperature lower than the glass transition temperature of the substrate material 104).

Figure 4:
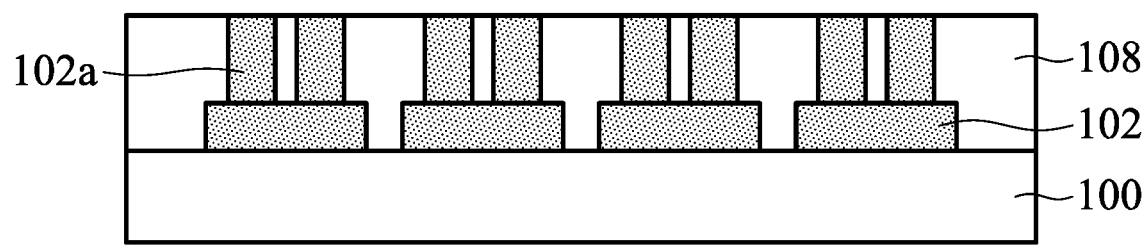

Then, as shown in FIG. 4, a removal process can be performed to remove a portion of the substrate 108 and expose the conductive structures 102a. For example, the removal process can include a polishing process, a chemical mechanical polishing (CMP) process, an etching process, other applicable processes, or a combination thereof. In some embodiments, the removal process also removes a portion of the conductive structures 102a. In some embodiments, the removal process results in a substantially planar surface of the substrate 108. As shown in FIG. 4, a top surface of the substrate 108 and a top surface of the conductive structures 102a can be substantially coplanar after the removal process.

Figure 5:
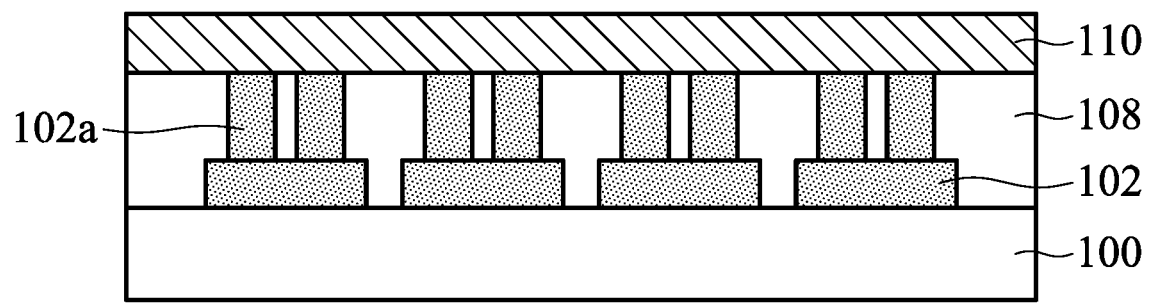

Then, as shown in FIG. 5, a patterned conductive layer 110 is formed on the light-emitting units 102, the conductive structures 102a, and the substrate 108. The patterned conductive layer 110 can be used to electrically connect the light-emitting units 102 to a driver unit which will subsequently be formed. For example, the patterned conductive layer 110 can include but are not limited to one or more conductive lines, one or more metal pads, or a combination thereof. The material of the patterned conductive layer 110 can include a metal (e.g., Cu, W, Ag, Sn, Ni, Cr, Ti, Pb, Au, Bi, Sb, Zn, Zr, Mg, In, Te, Ga, other applicable metals, an alloy thereof, or a combination thereof), other applicable conductive materials, or a combination thereof. In some embodiments, a conductive layer (not patterned) can be formed on the light-emitting units 102, the conductive structures 102a, and the substrate 108 by a physical vapor deposition method (e.g., evaporation, or sputter), an electroplating method, an atomic layer deposition method, other applicable methods, or a combination thereof, and then the patterned conductive layer 110 is formed using a lithography process (e.g., coating the resist, developing, removing the resist, other applicable processes, or a combination thereof), etching process, other applicable processes, or a combination thereof. In other embodiments, a patterned mask layer (not shown) having trenches corresponding to the patterned conductive layer 110 can be formed in advance on the light-emitting units 102, the conductive structures 102a, and the substrate 108, and then the patterned conductive layer 110 is formed by filling the trenches with applicable conductive materials and removing the patterned mask layer.

In some embodiments, the patterned conductive layer 110 can be replaced with a layer including a thin-film transistor (TFT) array.

Figure 6:
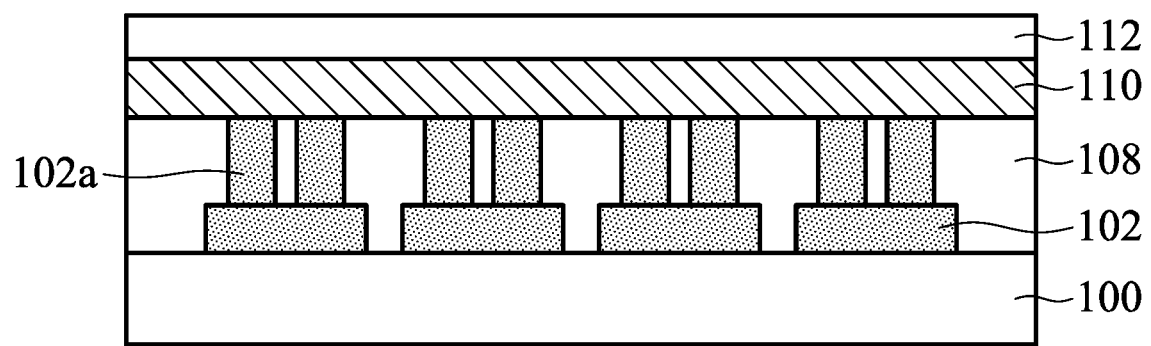

Then, as shown in FIG. 6, a protection layer 112 can be formed on the patterned conductive layer 110 to protect the patterned conductive layer 110 from being damaged in subsequent processes. For example, the protection layer 112 can include a polymer (e.g., polyimide), other applicable insulating materials, or a combination thereof. In some embodiments, the protection layer 112 can be formed by spin-on coating, rolling, vacuum lamination, chemical vapor deposition (CVD), plasma-enhanced chemical vapor deposition (PECVD), other applicable methods, or a combination thereof.

Figure 7:
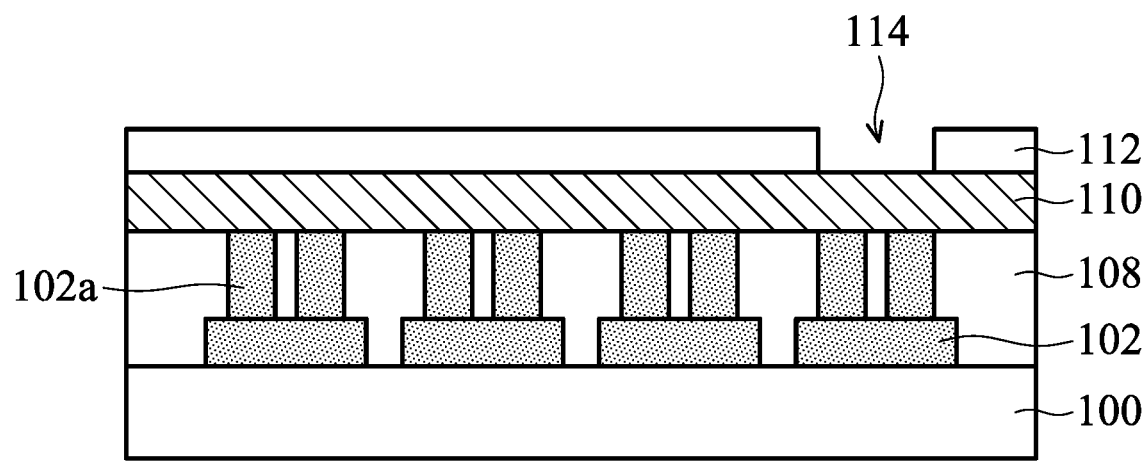

Then, as shown in FIG. 7, an opening 114 is formed in the protection layer 112. The opening 114 will be filled with an applicable conductive material to bond the driver unit and the patterned conductive layer 110 in a subsequent process. In some embodiments, the opening 114 can be formed in the protection layer 112 using a lithography process and/or an etching process. It should be noted that although, as an example, there is one opening 114 in the present embodiment, the disclosure is not limited thereto. Two or more openings 114 can be formed if needed.

Figure 8:
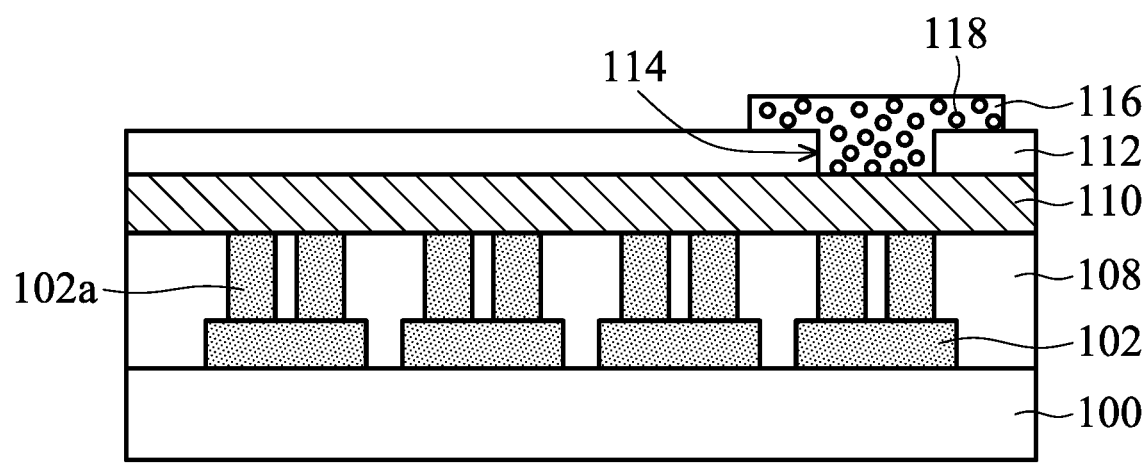

Then, as shown in FIG. 8, the opening 114 is filled with a conductive material 116. The conductive material 116 can be used to connect the driver and the patterned conductive layer 110 in a subsequent process. For example, the conductive material 116 can include metal alloy, solder paste, silver glue, other applicable conductive materials, or a combination thereof. In the present embodiment, the conductive material 116 is an anisotropic conductive film/paste (ACF or ACP) which can include a plurality of conductive particles 118 (e.g., metal particles). Under appropriate conditions, the electric current can only flow through the conductive material 116 in a direction substantially perpendicular to a top surface of the patterned conductive layer 110, and thus the device performance can be improved, and the details will be discussed in the following.

Figure 9:
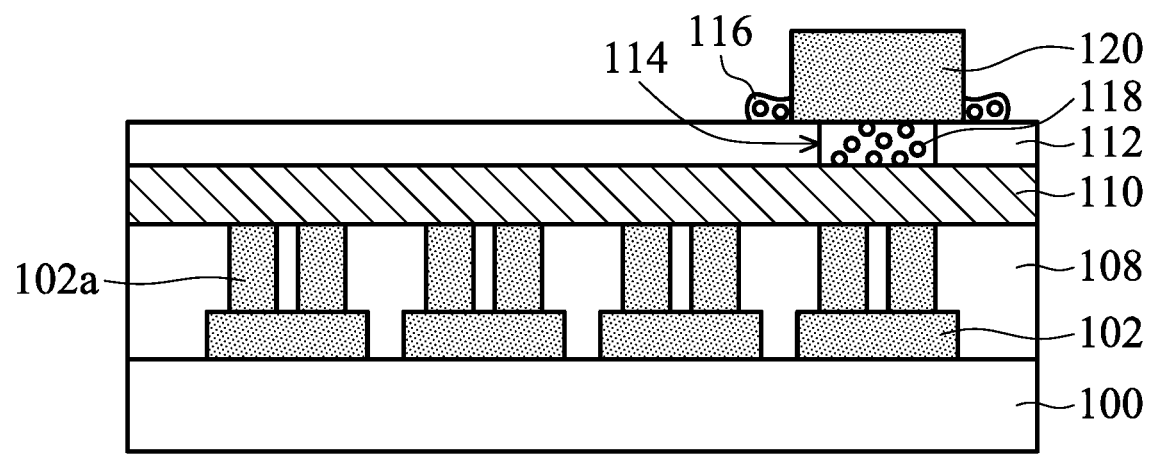

Then, as shown in FIG. 9, a driver unit 120 is disposed on the conductive material 116, such that the driver unit 120 is electrically connected to the light-emitting units 102 through the conductive material 116, the patterned conductive layer 110, and the conductive structures 102a. In some embodiments of which the conductive material 116 is an anisotropic conductive film, the conductive material 116 can be heated to an applicable temperature (e.g., 100-250° C.), and an applicable pressure (e.g., 0.1-10 MPa) can be applied, such that the driver unit 120 can be bonded to the patterned conductive layer 110 through the conductive material 116, and the electric current can only flow through the conductive material 116 in a direction substantially perpendicular to the top surface of the patterned conductive layer 110. For example, the driver unit 120 can include a driver chip, a circuit board, other applicable units, or a combination thereof. The driver unit 120 can be used to control the voltage and current for the light-emitting units 102. It should be noted that the example given in the present embodiment has light-emitting units 102 electrically connected to the driver unit 120, the present disclosure is not limited thereto. The light-emitting units 102 can be electrically connected to other types of devices or units if needed. In addition, although only one driver unit is illustrated in FIG. 9, the disclosure is not limited thereto. Two or more driver units can be disposed in the display device if needed.

Figure 10:
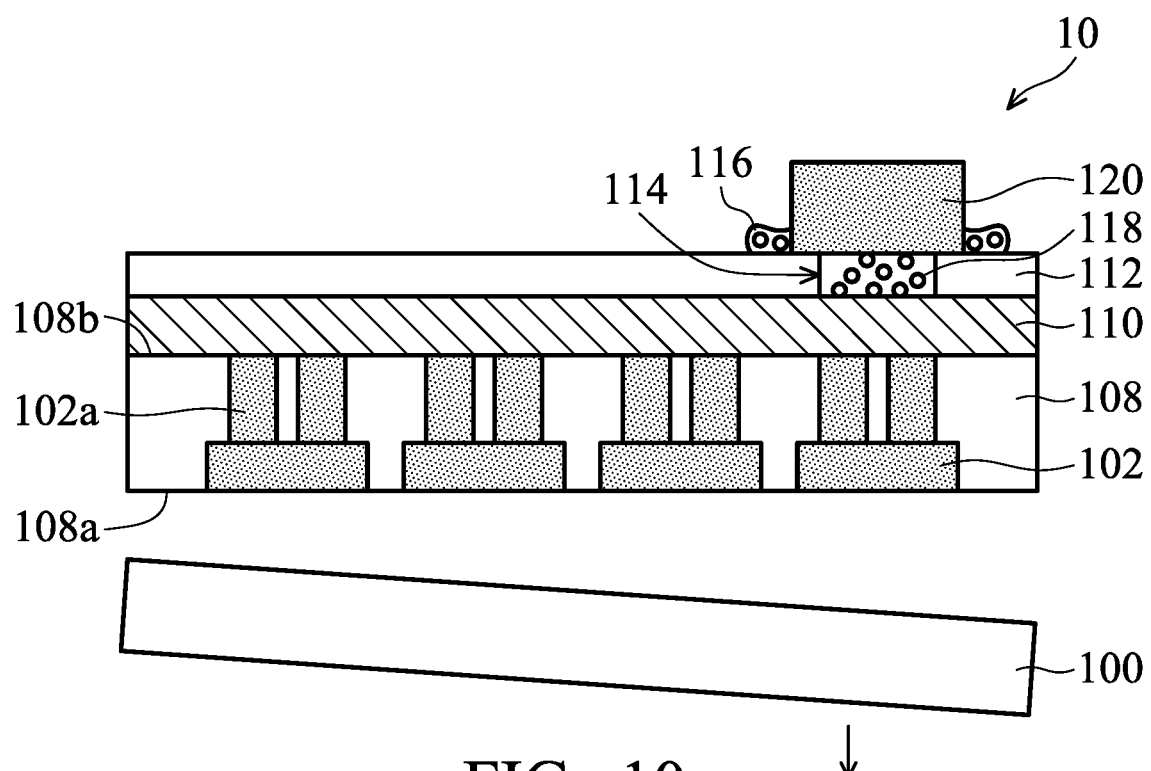

Then, as shown in FIG. 10, the carrier 100 is removed to form the display device 10 of the present embodiment. In some embodiments of which light-emitting units 102 are formed on the carrier 100 by semiconductor processes, the carrier 100 can be a semiconductor wafer, and thus the carrier 100 can be removed by polishing, etching, other applicable methods, or a combination thereof. In other embodiments, the light-emitting units 102 are bonded to the carrier 100 through an optical adhesive (e.g., UV-light adhesive), and thus a heating process can be used to reduce the adhesiveness of the optical adhesive, such that the carrier 100 can be peeled off.

As shown in FIG. 10, the substrate 108 of the display device 10 has a first surface 108a and a second surface 108b opposite to the first surface 108a. The light-emitting units 102 are disposed on the first surface 108a, and the driver unit 120 is disposed on the second surface 108b. The conductive structures 102a extend from the second surface 108b of the substrate 108 into the substrate 108, and can be used to electrically connect the light-emitting units 102 and the driver unit 120 on opposite surfaces of the substrate 108. Compared to display devices of which the light-emitting units and the driver unit are on the same surface of the substrate, the light-emitting units and the driver unit of the display device 10 of the present disclosure are on opposite surfaces of the substrate, and thus the peripheral area around the light-emitting units does not have to be sacrificed to dispose the drive unit r, and a borderless design can be achieved.

Figure 11:
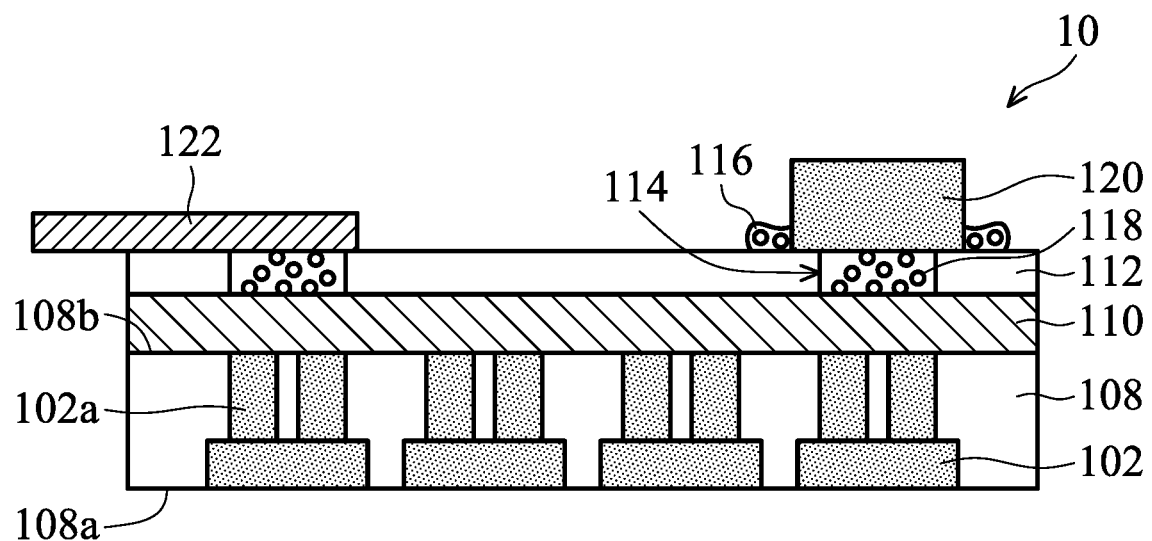
FIG. 11 illustrates a cross-sectional view of a display device according to some embodiments of the present disclosure.

Referring to FIG. 11, a connection structure 122 can be further disposed after the step of disposing the driver unit 120. The connection structure 122 can be used to connect the display device 10 to other display devices. For example, many display devices 10 are connected together through the connection structure(s) 122 to form a large-sized display device. For example, the connection structure 122 can include meal (e.g., metal line), metal alloy, or other applicable conductive materials. Is should be noted that when multiple display devices are connected together to form a large-sized display device, if the driver unit 120 and the light-emitting units 102 are disposed on the same surface of the substrate 108, the driver unit 120 will be disposed in a region between the display devices, and thus the visual effect of the large-sized display device may be poor. To the contrary, since the conductive structures are used to electrically connect the driver unit and the light-emitting units on opposite surfaces of the substrate in the embodiments of the present disclosure, when multiple display devices are connected together to form a large-sized display device, the driver unit 120 will not be disposed between the display devices, and thus the visual effect of the large-sized display device can be improved.

Figure 12:
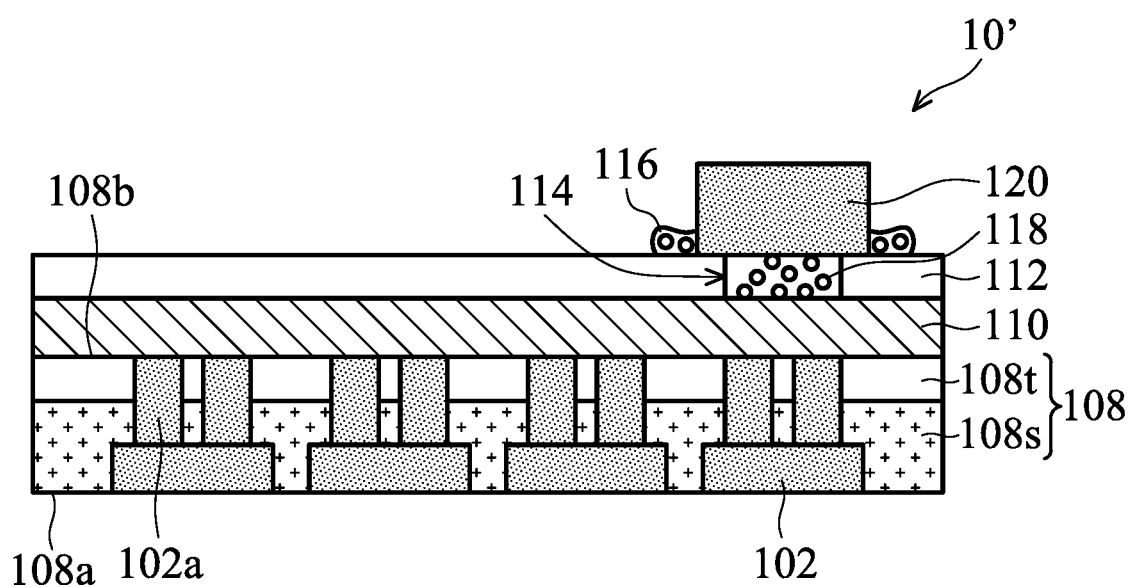
FIG. 12 illustrates a cross-sectional view of a display device according to some embodiments of the present disclosure.

Referring to FIG. 12, a variation of Embodiment 1 is illustrated. One difference between the display device 10' of the variation of Embodiment 1 and the display device 10 of Embodiment 1 is that the substrate 108 of the display device 10' includes a light-shielding region 108s and a non-light-shielding region 108t, and thus the display effect can be improved. For example, the light-shielding region 108s can include black resist, black printing ink, black resin, or any other light-shielding material of applicable colors. In some embodiments, light-shielding additives (e.g., carbon powders) can be added into the substrate material (e.g., precursor of polyimide, glass, other applicable materials, or a combination thereof) discussed above to form the light-shielding region 108s to shield the light. For example, the light-shielding region 108s including the light-shielding additives can be formed on the carrier 100 after the step illustrated in FIG. 1B, and then the non-light-shielding region 108t without the light-shielding additives can be formed on the light-shielding region 108s by the subsequent processes.

Figure 13:
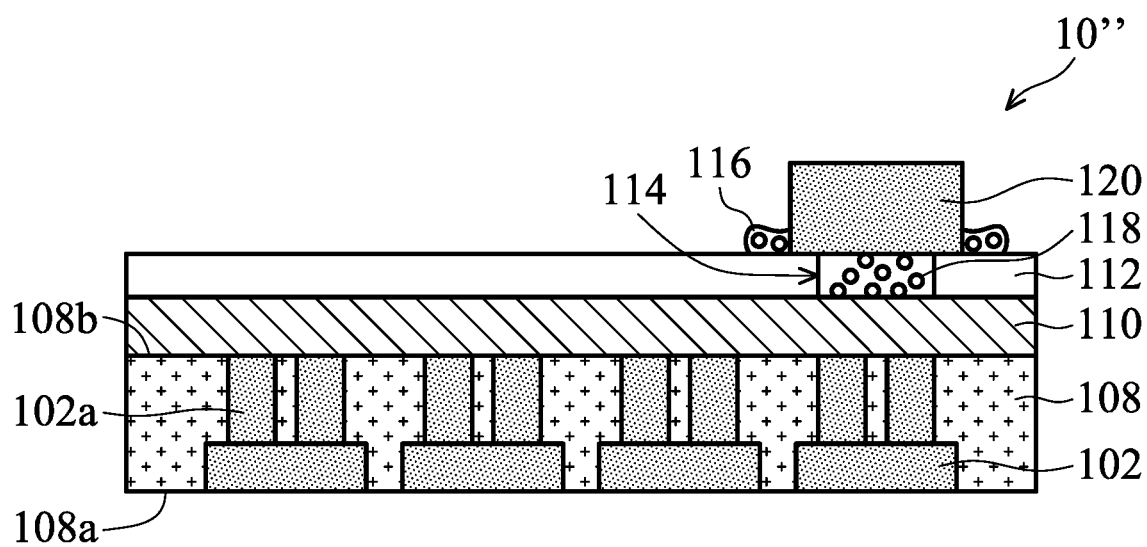
FIG. 13 illustrates a cross-sectional view of a display device according to some embodiments of the present disclosure.

Referring to FIG. 13, another variation of Embodiment 1 is illustrated. One difference between the display device 10" of the variation of Embodiment 1 and the display device 10 of Embodiment 1 is that the substrate 108 of the display device 10" is made of the substrate material including the light-shielding additives discussed above. In some embodiments, in the step illustrated in FIGS. 2A-2B, the substrate material including the light-shielding additives can be directly coated on the carrier 100, and thus an additional process is not needed to form the light-shielding region of the substrate, and therefore the production cost can be reduced.

Embodiment 2

The present embodiment provides another method for forming a display device. One difference between Embodiment 1 and Embodiment 2 is that the conductive structures of Embodiment 2 are formed in the substrate in advance.

Figure 14:
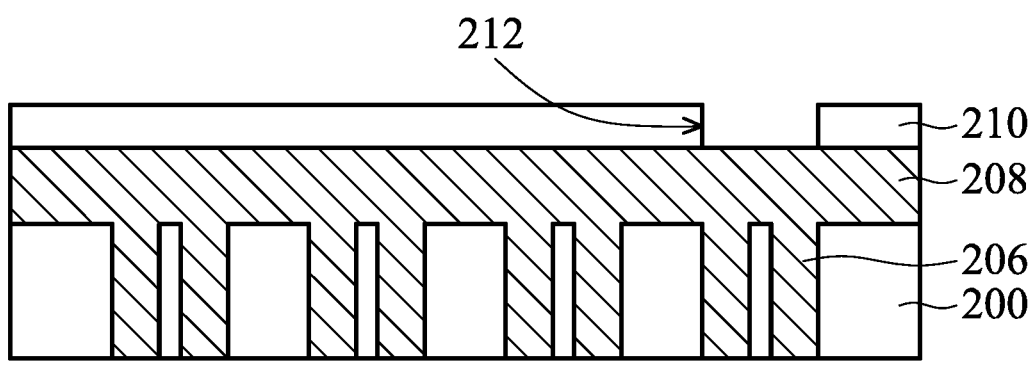
FIGS. 14-16 are a series of cross-sectional views illustrating a method for forming a display device according to Embodiment 2 of the present disclosure.

First, as shown in FIG. 14, a plurality of conductive structures 206 (e.g., vias) are formed in a substrate 200, and a patterned conductive layer 208 is formed on the conductive structures 206. For example, the substrate 200 can include substrates which are the same as, or similar to, the substrate 108 of Embodiment 1. In some embodiments, a plurality of through holes penetrating through the substrate 200 can be formed by mechanical drilling, laser drilling, lithography process, etching process, other applicable methods, or a combination thereof. Then, a physical vapor deposition process (e.g., evaporation, or sputter), an electroplating process, an atomic layer deposition process, other applicable processes, or a combination thereof can be performed to deposit Cu, W, Ag, Sn, Ni, Cr, Ti, Pb, Au, Bi, Sb, Zn, Zr, Mg, In, Te, Ga, an alloy thereof, other applicable conductive materials, or a combination thereof to form the conductive structures 206 (e.g., vias) in the through holes and a blanket conductive layer (not shown) on the substrate 200. Then, a lithography process, an etching process, other applicable processes, or a combination thereof can be performed to pattern the blanket conductive layer to form the patterned conductive layer 208. In other embodiments, after the through holes penetrating through the substrate 200 are formed, a patterned mask layer (not shown) having trenches corresponding to the patterned conductive layer 208 can be formed on the substrate 200 in advance, and then the conductive structures 206 and the patterned conductive layer 208 are formed by filling the through holes and the trenches with applicable conductive materials and removing the patterned mask layer. For example, the patterned conductive layer 208 can include but are not limited to one or more conductive lines, one or more metal pads, or a combination thereof.

In some embodiments, the patterned conductive layer 208 can be replaced with a layer including a thin-film transistor (TFT) array.

Then, still referring to FIG. 14, a protection layer 210 can be formed on the patterned conductive layer 208, and an opening 212 can be formed in the protection layer 210. For example, the protection layer 210 can include protection layers which are the same as, or similar to, the protection layer 112 discussed above.

Figure 15:
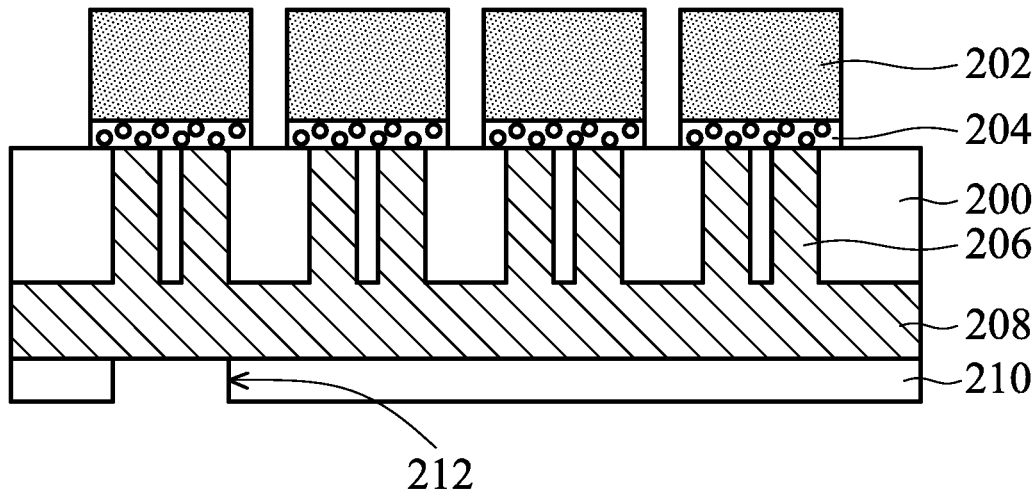

Then, as shown in FIG. 15, light-emitting units 202 can be bonded to the substrate 200 through a conductive material 204. For example, the light-emitting units 202 can include light-emitting units which are the same as, or similar to, the light-emitting units 102 of Embodiment 1. For example, the conductive material 204 can include conductive materials which are the same as, or similar to, the conductive material 116 (e.g., anisotropic conductive film) of Embodiment 1.

Figure 16:
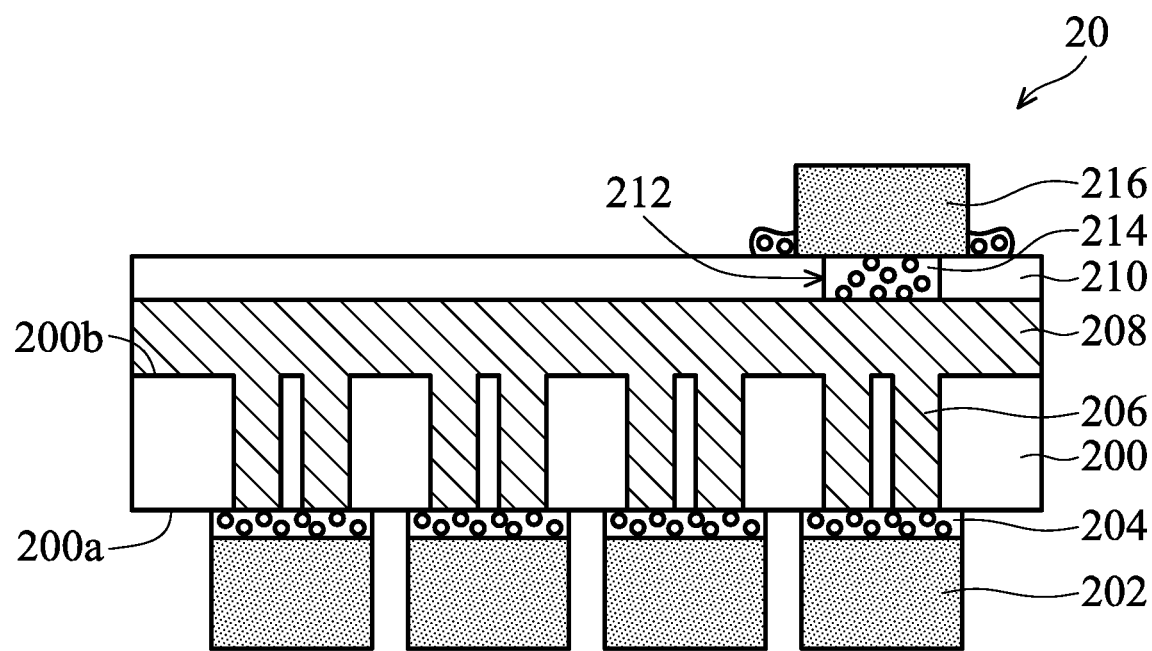

Then, as shown in FIG. 16, the opening 212 is filled with a conductive material 214, and a driver unit 216 is bonded to the patterned conductive layer 208 through the conductive material 214 to form the display device 20 of the present embodiment. For example, the conductive material 214 can include conductive materials which are the same as, or similar to, the conductive material 116 discussed above, and the driver unit 216 can include devices which are the same as, or similar to, the driver unit 120 discussed above.

As shown in FIG. 16, the substrate 200 of the display device 20 has a first surface 200a and a second surface 200b opposite to the first surface 200a. The light-emitting units 202 are disposed on the first surface 200a of the substrate 200, and the driver unit 216 is disposed on the second surface 200b of the substrate 200. The conductive structures 206 extend from the second surface 200b of the substrate 200 into the substrate 200, and can be used to electrically connect the light-emitting units 202 and the driver unit 216 on opposite surfaces of the substrate 200. Similar to the display device 10 of Embodiment 1, the driver unit and the light-emitting units of the display device 20 of the present embodiment are also respectively disposed on opposite surfaces of the substrate, and thus a borderless design can be achieved.

It should be noted that the display device of the present embodiment can also include the same or a similar connection structure as illustrated in FIG. 11 and the same or a similar light-shielding region as illustrated in FIGS. 12-13, and thus the same or similar advantages can be obtained.

Embodiment 3

The present embodiment provides yet another method for forming a display device. One difference between Embodiment 1 and Embodiment 3 is that the conductive structures of Embodiment 3 are formed after the formation of the substrate.

Figure 17:
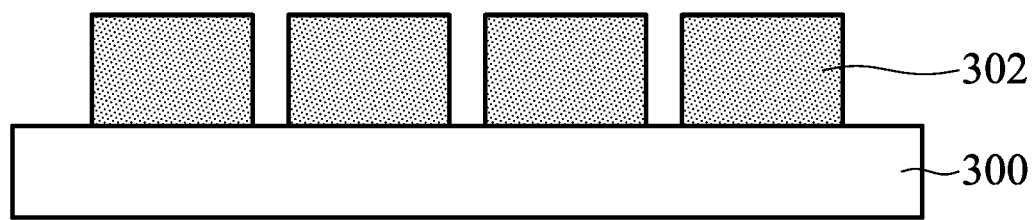
FIGS. 17-24 are a series of cross-sectional views illustrating a method for forming a display device according to Embodiment 3 of the present disclosure.

FIG. 17 illustrates a cross-sectional view of the process for the display device of the present embodiment. As shown in FIG. 17, a carrier 300 with a plurality of light-emitting units 302 disposed thereon is provided. For example, the carrier 300 can include carriers that are the same as, or similar to, the carrier 100 of Embodiment 1, and the light-emitting units 302 can include light-emitting units that are the same as, or similar to, the light-emitting units 102 of Embodiment 1. For example, the carrier 300 can be a semiconductor wafer, and the light-emitting units 302 can be directly formed on the carrier 300 through applicable semiconductor processes.

Figure 18:
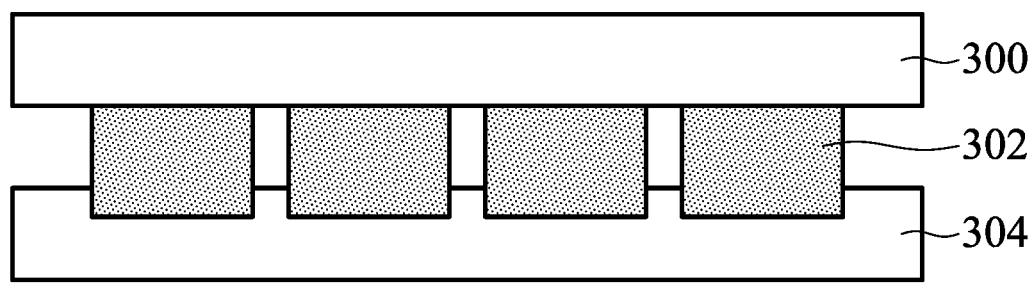

Then, as shown in FIG. 18, an adhesive layer 304 is coated on the light-emitting units 302. In some embodiments, the adhesive layer 304 can include optical adhesive, pressure sensitive adhesive, other applicable adhesives, or a combination thereof. For example, the carrier 300 and the light-emitting units 302 can be flipped, and then a portion of the light-emitting units 302 is immersed in the adhesive layer 304 which may be disposed on another carrier or in a tank, such that the adhesive layer 304 is coated on the light-emitting units 302.

Figure 19:
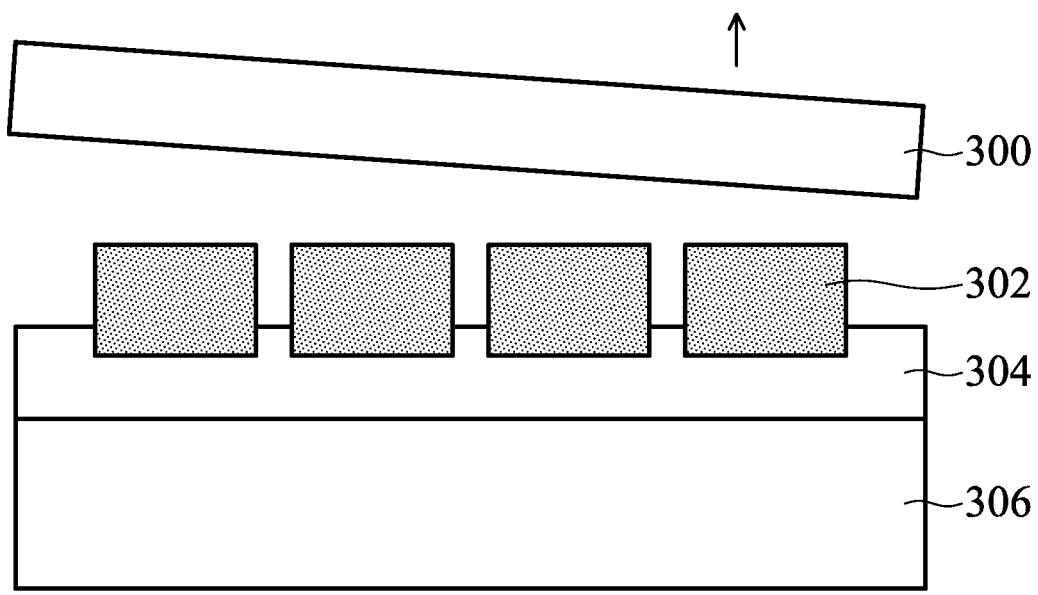

Then, as shown in FIG. 19, the light-emitting units 302 are bonded to another carrier 306 through the adhesive layer 304, and then the carrier 300 is removed. For example, the carrier 300 can be removed by polishing, etching, other applicable methods, or a combination thereof.

Figure 20:
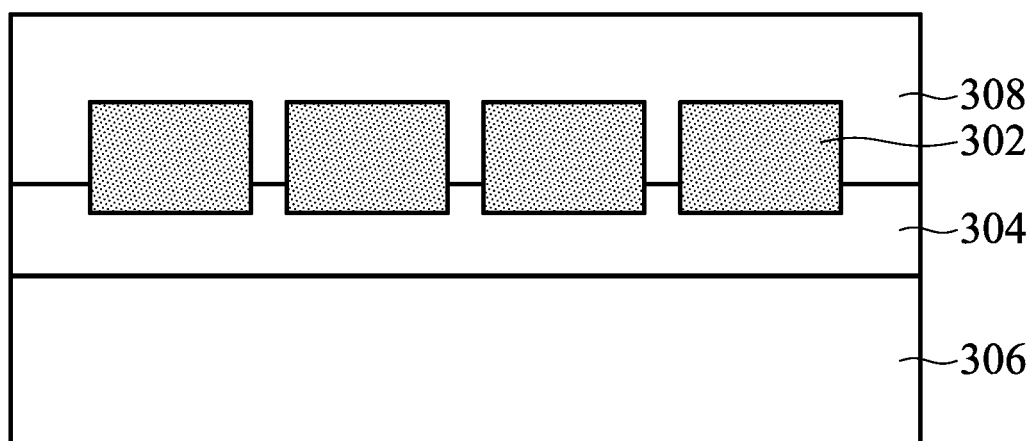

Then, as shown in FIG. 20, a substrate material is coated on the adhesive layer 304 to surround the light-emitting units 302, and then a curing process can be performed to cure the substrate material to form a substrate 308. For example, the substrate material of the present embodiment can include substrate materials that are the same as, or similar to, the substrate material 104 of Embodiment 1, and the substrate 308 can include substrates that are the same as, or similar to, the substrate 108 of Embodiment 1.

Figure 21:
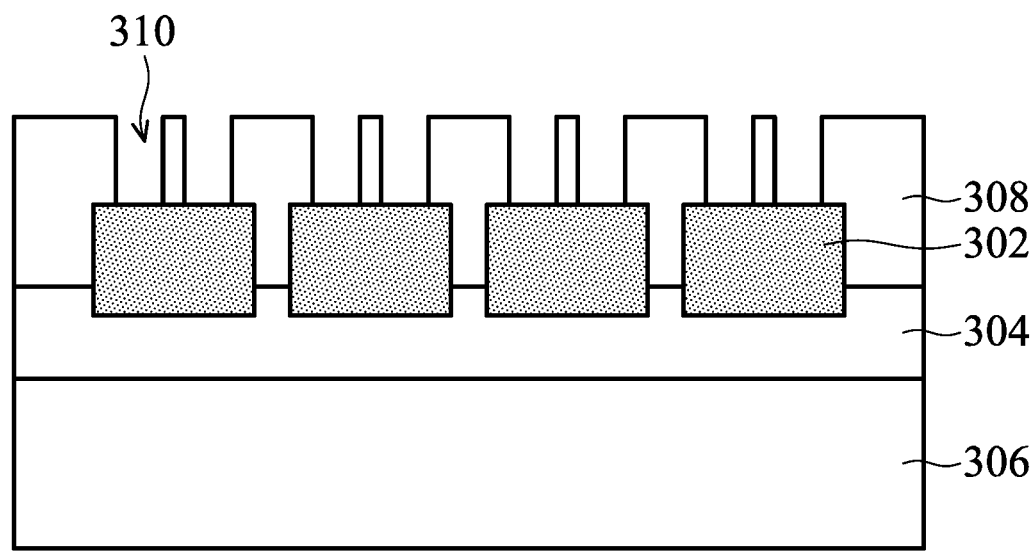

Then, as shown in FIG. 21, a portion of the substrate 308 is removed to form a plurality of openings 310, such that a portion of the light-emitting units 302 is exposed from the openings 310. For example, the openings 310 can be formed in the substrate 308 using lithography process, etching process, mechanical drilling, laser drilling, other applicable processes, or a combination thereof.

Figure 22:
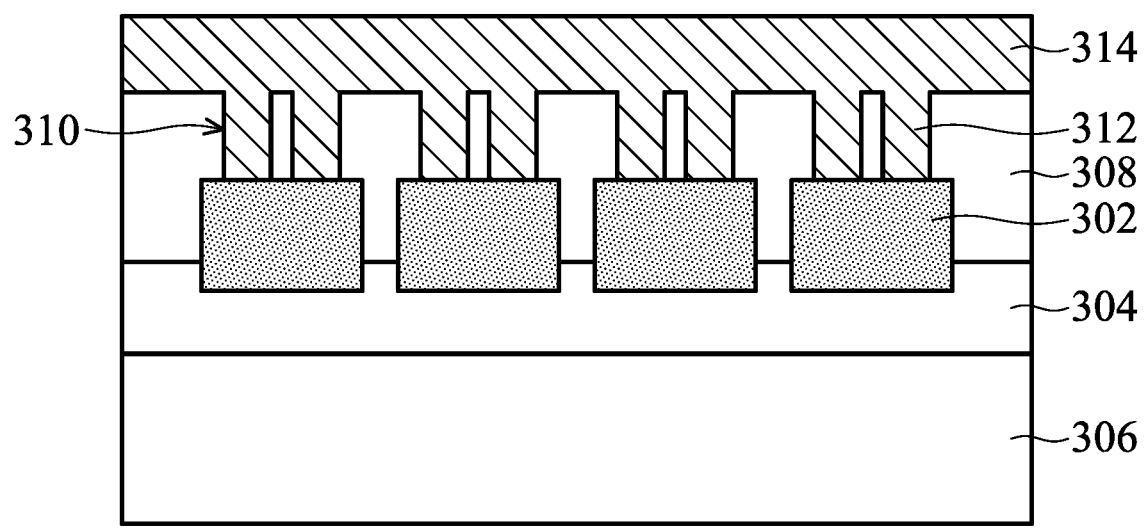

Then, as shown in FIG. 22, a plurality of conductive structures 312 (e.g., vias) are formed in the openings 310, and a patterned conductive layer 314 is formed on the conductive structures 312. In some embodiments, a physical vapor deposition process (e.g., evaporation, or sputter), an electroplating process, an atomic layer deposition process, other applicable processes, or a combination thereof can be performed to deposit Cu, W, Ag, Sn, Ni, Cr, Ti, Pb, Au, Bi, Sb, Zn, Zr, Mg, In, Te, Ga, an alloy thereof, other applicable conductive materials, or a combination thereof to form the conductive structures 312 in the openings 310 and a blanket conductive layer (not shown) on the substrate 308. Then, a lithography process, an etching process, a chemical mechanical polishing process, other applicable methods, or a combination thereof can be performed to pattern the blanket conductive layer to form the patterned conductive layer 314. In other embodiments, a patterned mask layer (not shown) having trenches corresponding to the patterned conductive layer 314 can be formed on the substrate 308 in advance, and then the conductive structures 312 and the patterned conductive layer 314 are formed by filling the openings 310 and the trenches with applicable conductive materials and removing the patterned mask layer. For example, the patterned conductive layer 314 can include but are not limited to one or more conductive lines, one or more metal pads, or a combination thereof.

In some embodiments, the patterned conductive layer 314 can be replaced with a layer that includes a thin-film transistor (TFT) array.

Figure 23:
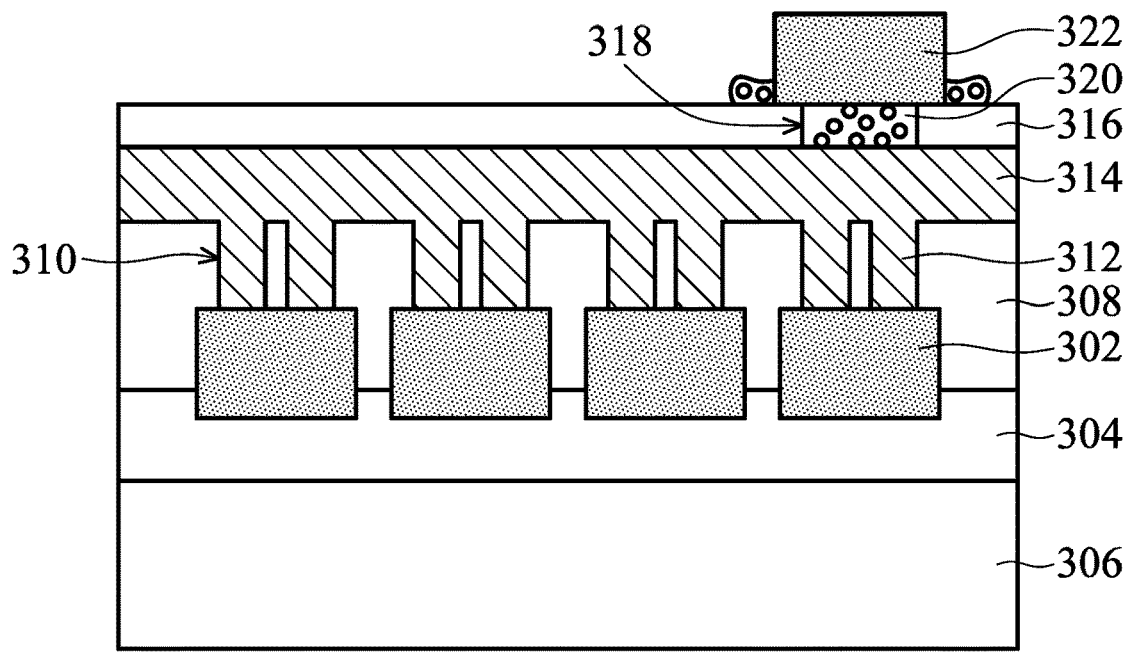

Then, as shown in FIG. 23, a protection layer 316 can be formed on the patterned conductive layer 314, and an opening 318 can be formed in the protection layer 316. Then, the opening 318 is filled with a conductive material 320, and a driver unit 322 is bonded to the patterned conductive layer 314 through the conductive material 320. For example, the protection layer 316 can include materials that are the same as, or similar to, the protection layer 112 discussed above, the conductive material 320 can include materials that are the same as, or similar to, the conductive material 116 discussed above, and the driver unit 322 can include devices that are the same as, or similar to, the driver unit 120 discussed above.

Figure 24:
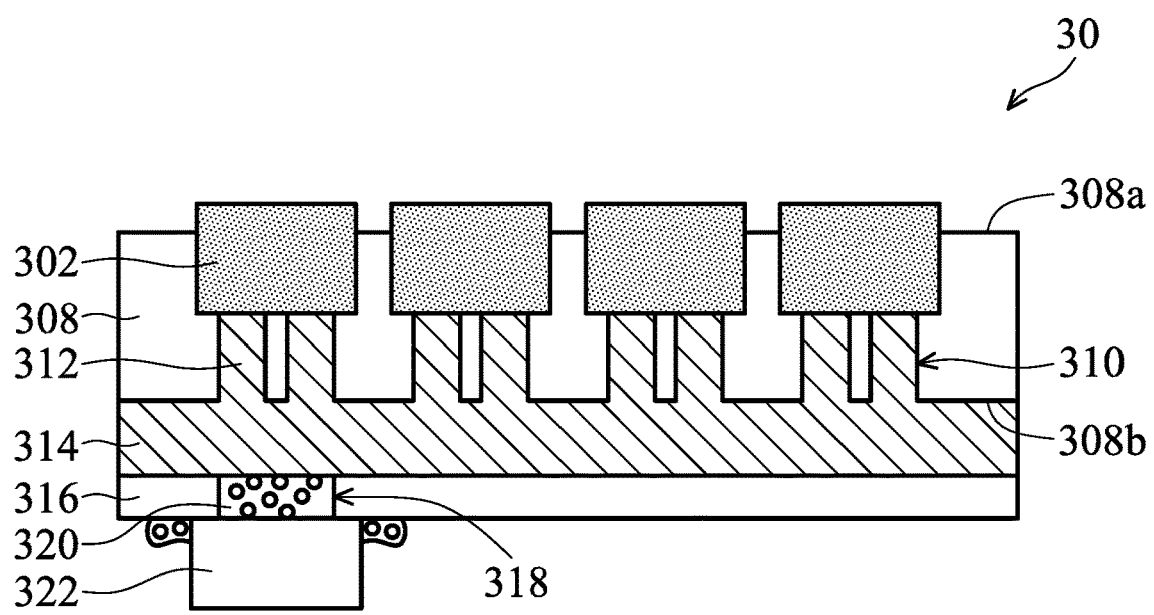

Then, as shown in FIG. 24, the carrier 300 and the adhesive layer 304 are removed to form the display device 30 of the present embodiment. As shown in FIG. 24, the substrate 308 of display device 30 has a first surface 308a and a second surface 308b opposite to the first surface 308a. The light-emitting units 302 are disposed on the first surface 308a of the substrate 308, and the driver unit 322 is disposed on the second surface 308b of the substrate 308. As shown in FIG. 24, the conductive structures 312 extend from the second surface 308b of the substrate 308 into the substrate 308, and can be used to electrically connect the light-emitting units 302 and the driver unit 322 on opposite surfaces of the substrate 308. Similar to the display device 10 of Embodiment 1, the driver unit and the light-emitting units of the display device 30 of the present embodiment are also respectively disposed on opposite surfaces of the substrate, and thus a borderless design can be achieved.

It should be noted that the display device of the present embodiment can also include the same or a similar connection structure as illustrated in FIG. 11 and the same or a similar light-shielding region as illustrated in FIGS. 12-13, and thus the same or similar advantages can be obtained.

Embodiment 4

The present embodiment provides yet another method for forming a display device. The display device includes a layer containing one or more thin-film transistors.

Figure 25:
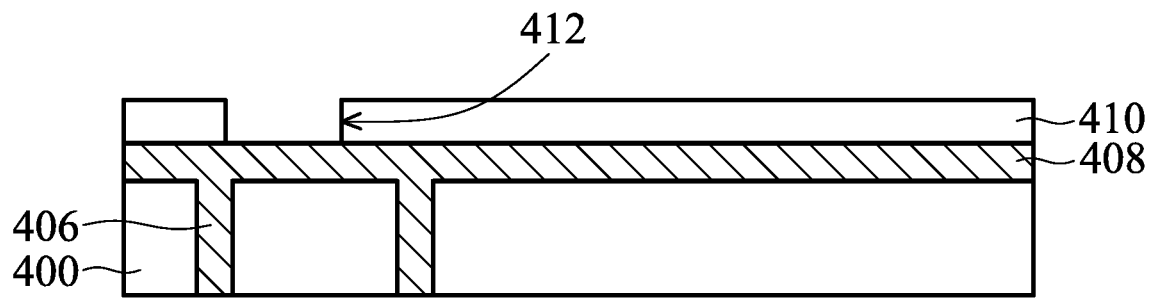
FIGS. 25-28 are a series of cross-sectional views illustrating a method for forming a display device according to Embodiment 4 of the present disclosure.

FIG. 25 illustrates a cross-sectional view of the process for the display device of the present embodiment. As shown in FIG. 25, a substrate 400 is provided. The substrate 400 can include substrates that are the same as, or similar to, the substrate 108 of Embodiment 1.

Then, as shown in FIG. 25, a plurality of conductive structures 406 (e.g., vias) are formed in the substrate 400, and a patterned conductive layer 408 is formed on the conductive structures 406. In some embodiments, a plurality of through holes penetrating through the substrate 400 can be formed by mechanical drilling, laser drilling, a lithography process, an etching process, other applicable methods, or a combination thereof. Then, a physical vapor deposition process (e.g., evaporation, or sputter), an electroplating process, an atomic layer deposition process, other applicable processes, or a combination thereof can be performed to deposit Cu, W, Ag, Sn, Ni, Cr, Ti, Pb, Au, Bi, Sb, Zn, Zr, Mg, In, Te, Ga, an alloy thereof, other applicable conductive materials, or a combination thereof to form the conductive structures 406 (e.g., vias) in the through holes and a blanket conductive layer (not shown) on the substrate 400. Then, a lithography process, an etching process, other applicable processes, or a combination thereof can be performed to pattern the blanket conductive layer to form the patterned conductive layer 408. In other embodiments, after the through holes penetrating through the substrate 400 are formed, a patterned mask layer (not shown) having trenches corresponding to the patterned conductive layer 408 can be formed on the substrate 400 in advance, and then the conductive structures 406 and the patterned conductive layer 408 are formed by filling the through holes and the trenches with applicable conductive materials and removing the patterned mask layer. For example, the patterned conductive layer 408 can include but are not limited to one or more conductive lines, one or more metal pads, or a combination thereof.

Still referring to FIG. 25, a protection layer 410 is formed on the patterned conductive layer 408, and an opening 412 can be formed in the protection layer 410. For example, the protection layer 410 can include protection layers that are the same as, or similar to, the protection layer 112 discussed above.

Figure 26:
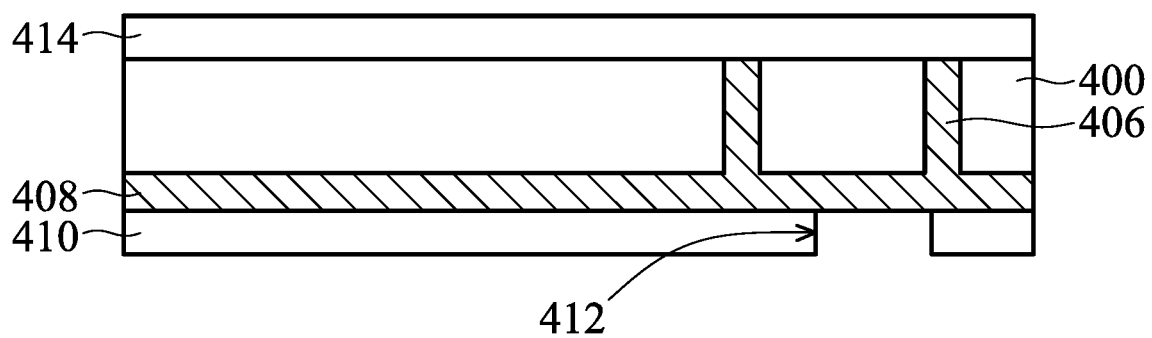

Then, as shown in FIG. 26, a layer 414 including a thin-film transistor array is formed on a surface of the substrate 400 opposite to the patterned conductive layer 408. For example, the transistors can include gates, gate dielectric layers, and sources/drains, and one or more interlayer dielectric (ILD) layers can be disposed on the transistors. In some embodiments, the transistors can be used to control the voltage and current for the light-emitting units.

Figure 27:
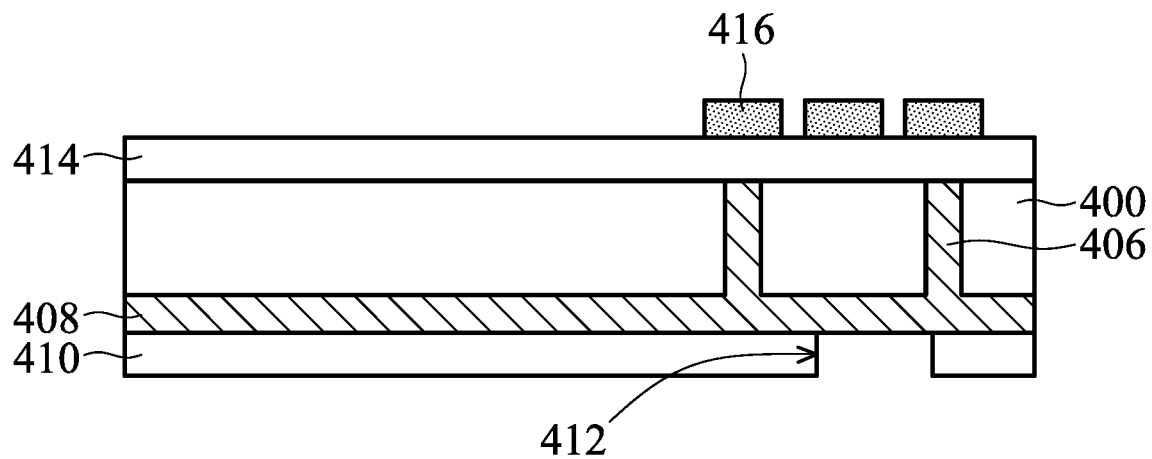

Then, as shown in FIG. 27, a plurality of light-emitting units 416 are formed on the layer 414 including a thin-film transistor array. For example, the light-emitting units 416 can include units that are the same as, or similar to, the light-emitting units 102 of Embodiment 1. In some embodiments, the light-emitting units 416 can be formed by evaporation (e.g., evaporation of an organic material), sputtering, other applicable methods, or a combination thereof.

Figure 28:
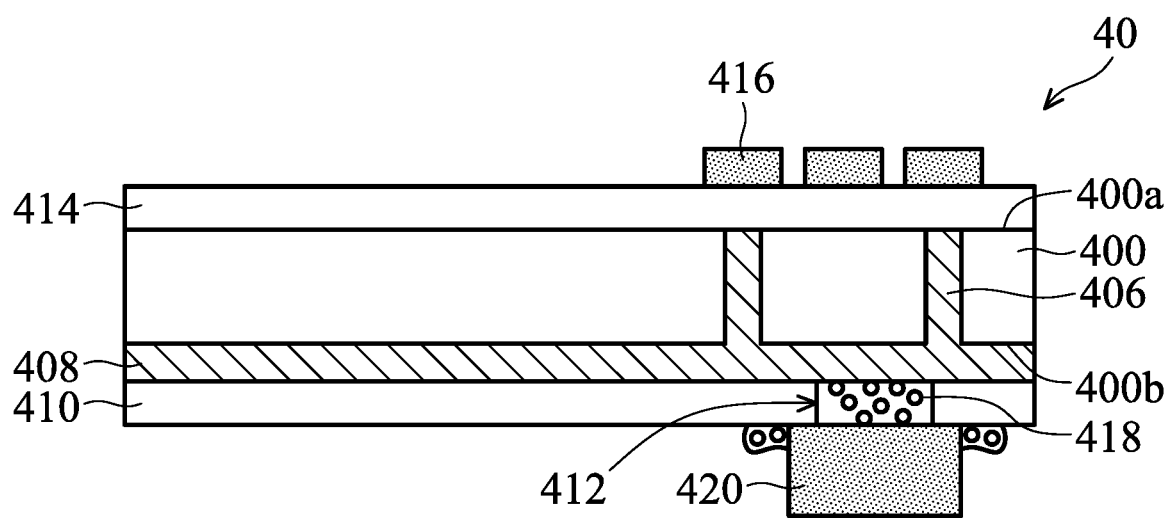

Then, as shown in FIG. 28, the opening 412 is filled with a conductive material 418, and the driver unit 420 is bonded to the patterned conductive layer 408 through the conductive material 418 to form the display device 40 of the present embodiment. For example, the conductive material 418 can include materials that are the same as, or similar to, the conductive material 116 discussed above, and the driver unit 420 can include devices that are the same as, or similar to, the driver unit 120 discussed above.

As shown in FIG. 28, the substrate 400 of display device 40 has a first surface 400a and a second surface 400b opposite to the first surface 400a. The light-emitting units 416 are disposed on the first surface 400a of the substrate 400, and the driver unit 420 is disposed on the second surface 400b of the substrate 400. As shown in FIG. 24, the conductive structures 406 extend from the second surface 400b of the substrate 400 into the substrate 400, and can be used to electrically connect the light-emitting units 416 and the driver unit 420 on opposite surfaces of the substrate 400. Similar to the display device 10 of Embodiment 1, the driver unit and the light-emitting units of the display device 40 of the present embodiment are also respectively disposed on opposite surfaces of the substrate, and thus a borderless design can be achieved.

Figure 29:
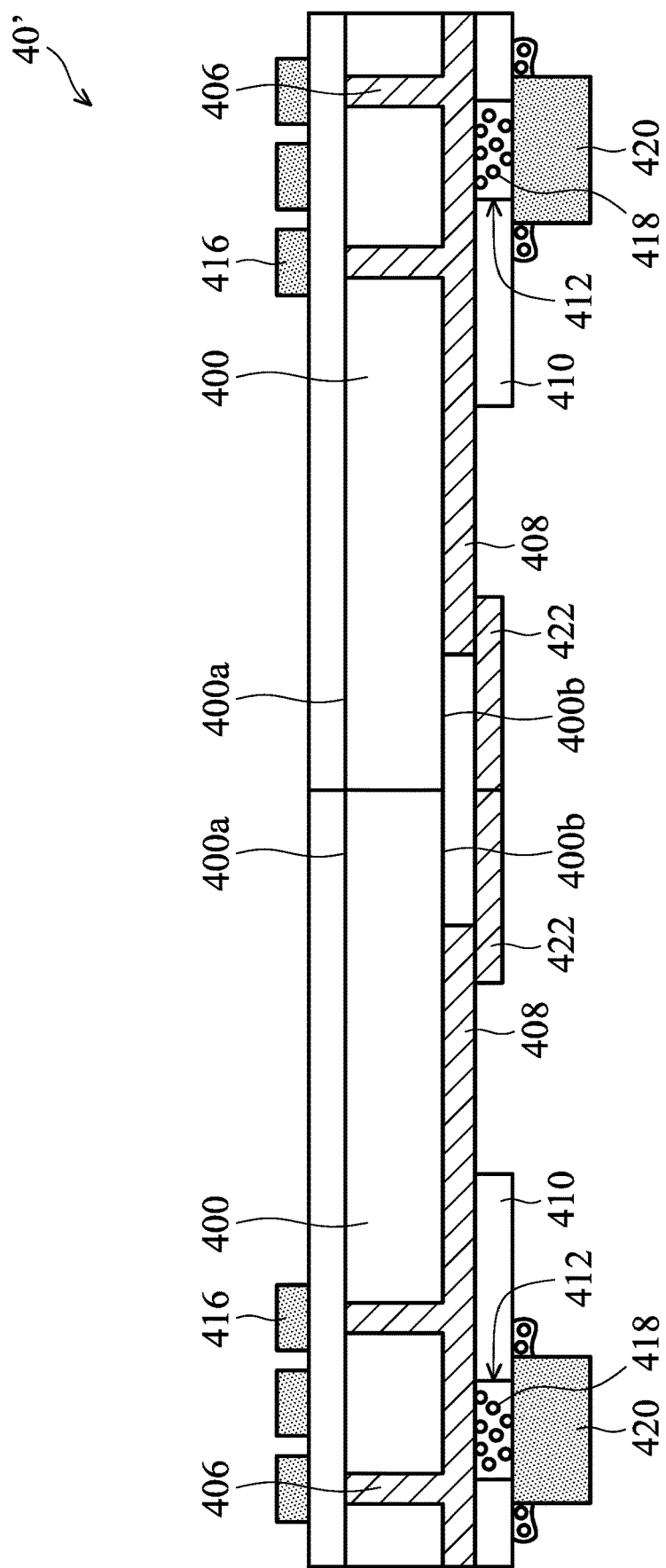
FIG. 29 illustrates a cross-sectional view of a display device according to some embodiments of the present disclosure.

It should be noted that the display device of the present embodiment can also include the same or a similar connection structure as illustrated in FIG. 11 and the same or a similar light-shielding region as illustrated in FIGS. 12-13, and thus the same or similar advantages can be obtained. For example, a connection structure 422 can be bonded to the display device 40 through the patterned conductive layer 408. The connection structure(s) 422 can be used to connect two or more display devices 40 together to form a large-sized display device 40' (as shown in FIG. 29).

In summary, the display device of the present disclosure includes light-emitting units (e.g., light-emitting diodes, organic light-emitting diodes, other applicable light-emitting units, or a combination thereof) disposed on the first surface of the substrate, a driver unit (or other units) disposed on the second surface of the substrate opposite to the first surface of the substrate, and conductive structures used to electrically connect the light-emitting units and the driver unit. Therefore, the display device of the present disclosure does not have to sacrifice the peripheral area around the light-emitting units for disposing the driver unit, and thus a borderless design can be achieved.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim can be an individual embodiment of the present disclosure, and the scope of the present disclosure includes the combinations of every claim and every embodiment of the present disclosure.

What is claimed is:

1. A display device, comprising:
    a substrate having a first surface and a second surface opposite to the first surface;
    a thin-film transistor array disposed on the first surface, comprising a plurality of transistors;
    a plurality of light-emitting units disposed on the thin-film transistor array, wherein the plurality of transistors are configured to control the voltage or the current for the light-emitting units;
    a plurality of conductive structures penetrating through the substrate from the first surface to the second surface, wherein the plurality of conductive structures are corresponding to the plurality of light-emitting units and electrically connected to the plurality of light-emitting units;
    a driver unit disposed on the second surface of the substrate;
    a patterned conductive layer disposed between the substrate and the driver unit;
    a protection layer disposed on the patterned conductive layer, wherein the protection layer has an opening that exposes the patterned conductive layer; and
    a conductive material disposed in the opening,
    wherein the driver unit is electrically connected to the plurality of light emitting units through the conductive material, the patterned conductive layer and the plurality of conductive structures.

2. The display device as claimed in claim 1, wherein the conductive material comprises an anisotropic conductive film (ACF).

3. The display device as claimed in claim 1, wherein the plurality of light-emitting units comprise light-emitting diodes, organic light-emitting diodes, or a combination thereof.

4. The display device as claimed in claim 1, wherein a material of the substrate comprises glass, polyimide, or a combination thereof.

5. The display device as claimed in claim 1, wherein the substrate comprises a light-shielding region disposed between the plurality of light-emitting units.

6. The display device as claimed in claim 5, wherein a material of the light-shielding region of the substrate comprises polyimide.

7. The display device as claimed in claim 1, wherein the light-emitting units are embedded in the substrate.

\* \* \* \* \*